United States Patent
Kozintsev et al.

(10) Patent No.: US 7,584,404 B2
(45) Date of Patent: Sep. 1, 2009

(54) METHOD AND APPARATUS FOR MULTIMEDIA COMMUNICATION OVER PACKET CHANNELS

(75) Inventors: Igor V. Kozintsev, San Jose, CA (US); Michail A. Ilyin, Nishni Novgorod (RU); Roman A. Belenov, Nizhni Novgorod (RU); Sergey N. Zheltov, Nizhny Novgorod (RU)

(73) Assignee: Intel Corporation, Santa Clara, CA (US)

(*) Notice: Subject to any disclaimer, the term of this patent is extended or adjusted under 35 U.S.C. 154(b) by 1098 days.

(21) Appl. No.: 10/325,416

(22) Filed: Dec. 19, 2002

(65) Prior Publication Data
US 2004/0123211 A1  Jun. 24, 2004

(51) Int. Cl.
*H03M 13/00* (2006.01)
*H04L 1/18* (2006.01)

(52) U.S. Cl. .................... 714/776; 714/749

(58) Field of Classification Search ......... 714/748–749, 714/746, 751–752, 758, 756, 776, 800; 370/235, 370/242, 341, 442, 473
See application file for complete search history.

(56) References Cited

U.S. PATENT DOCUMENTS

| | | | |
|---|---|---|---|
| 5,844,918 A * | 12/1998 | Kato | 714/751 |
| 5,983,382 A * | 11/1999 | Pauls | 714/744 |
| 6,574,668 B1 * | 6/2003 | Gubbi et al. | 709/237 |
| 6,629,285 B1 * | 9/2003 | Gerendai et al. | 714/748 |
| 6,851,084 B2 * | 2/2005 | Pattavina | 714/776 |
| 6,891,847 B1 * | 5/2005 | Gubbi | 370/442 |
| 7,093,015 B2 * | 8/2006 | Gubbi et al. | 709/225 |
| 7,095,729 B2 * | 8/2006 | Sachs et al. | 370/341 |
| 2002/0080802 A1 * | 6/2002 | Sachs et al. | 370/401 |

OTHER PUBLICATIONS

"Hybrid ARQ for robust video streaming over wireless LANs" by Daniel Grobe Sachs et al, IEEE, Apr. 2-4, 2001.*

* cited by examiner

*Primary Examiner*—Phung M Chung
(74) *Attorney, Agent, or Firm*—Derek J. Reynolds

(57) ABSTRACT

A method and apparatus to provide communications over a packet channel, including applying a forward error correction (FEC) code to a first group of data packets to create a coded group of packets by supplementing a set of parity packets to the first group of data packets; and transmitting the first group of data packets, and transmitting the set of corresponding parity packets after the first group of data packets have been transmitted. In response to receiving a positive acknowledgement corresponding to the first group of packets, ceasing to send parity packets corresponding to the first group of packets and sending a second group of data packets dependent on the first group of data packets. In response to not receiving the acknowledgment, not sending the second group of data packets and continuing to transmit the parity packets corresponding to the first group of data packets.

14 Claims, 5 Drawing Sheets

METHOD AND APPARATUS FOR MULTIMEDIA COMMUNICATION OVER PACKET CHANNELS

One or more embodiments of the invention relate generally to the field of communications. More particularly, one or more of the embodiments relate to a method and apparatus of communication over packet channels.

BACKGROUND

In order to distribute and store multimedia data, the multimedia data is transmitted over a communication channel. Multimedia data primarily refers to audio and visual data but may also include other types of data. The channel is often subject to noise and interference, as in the case of wireless channel, and to congestion, as in the case of a wired Internet, both resulting in loss of data during transmission.

Two methods can be used to combat data losses during transmission. Forward error correction (FEC) is a method of transforming the data message, represented by a sequence of symbols from a finite alphabet, by supplementing a parity data, another sequence of symbols, to ensure that if components of a codeword are altered below some designated threshold, the original data can usually be extracted intact. FEC therefore provides error resilience by increasing the amount of data to be sent. FEC does not require a return channel and is typically not adaptive to the current state of the channel. However, FEC does not guarantee that the data will arrive to the receiver without errors. A higher-level protocol implementing some form of repeat request for data that tolerates little errors is required for this to be addressed. Alternatively, in multimedia communications the delay requirements often dominate the error-free transmission requirements, making error-free transmission a lesser priority.

Basic automatic repeat request (ARQ) is an alternative approach to assist in robust data communications. ARQ operates by dividing the data into packets and appending a special error check sequence to each packet for error detection purpose. The data packets and error checks are communicated over a channel and the receiver decides whether a transmission error occurred by calculating the check sequence and comparing the calculated check sequence to the appended error check sequence. If a discrepancy is found, the error is declared and the receiver sends a request the transmitter using the return channel to resend the packet by sending a negative acknowledgement signal. If no discrepancy is found, the receiver sends a positive acknowledgement signal to the transmitter. To alert the transmitter of the error, ARQ requires a two-way communication channel to be present. Often, the return channel uses the same physical medium as the forward channel, effectively expanding the data size because of retransmissions and communication of control information. The difference between the FEC and ARQ is that ARQ is inherently channel adaptive, since only lost packets are retransmitted, while FEC typically adds overhead to all packets. Yet, ARQ may introduce significant delays due to roundtrip propagation time and processing time. The last condition significantly limits the application of ARQ to multimedia communications.

DETAILED DESCRIPTION

A method and apparatus are described herein to provide a new technique for communications over packet channels. According to one embodiment, the method and apparatus deacribed herein include an FEC and ARQ component, (which may be referred to as a hybrid automatic repeat request (HARQ)), and in particular, a technique for scheduling transmission of interdependent data packets.

Figure 1:
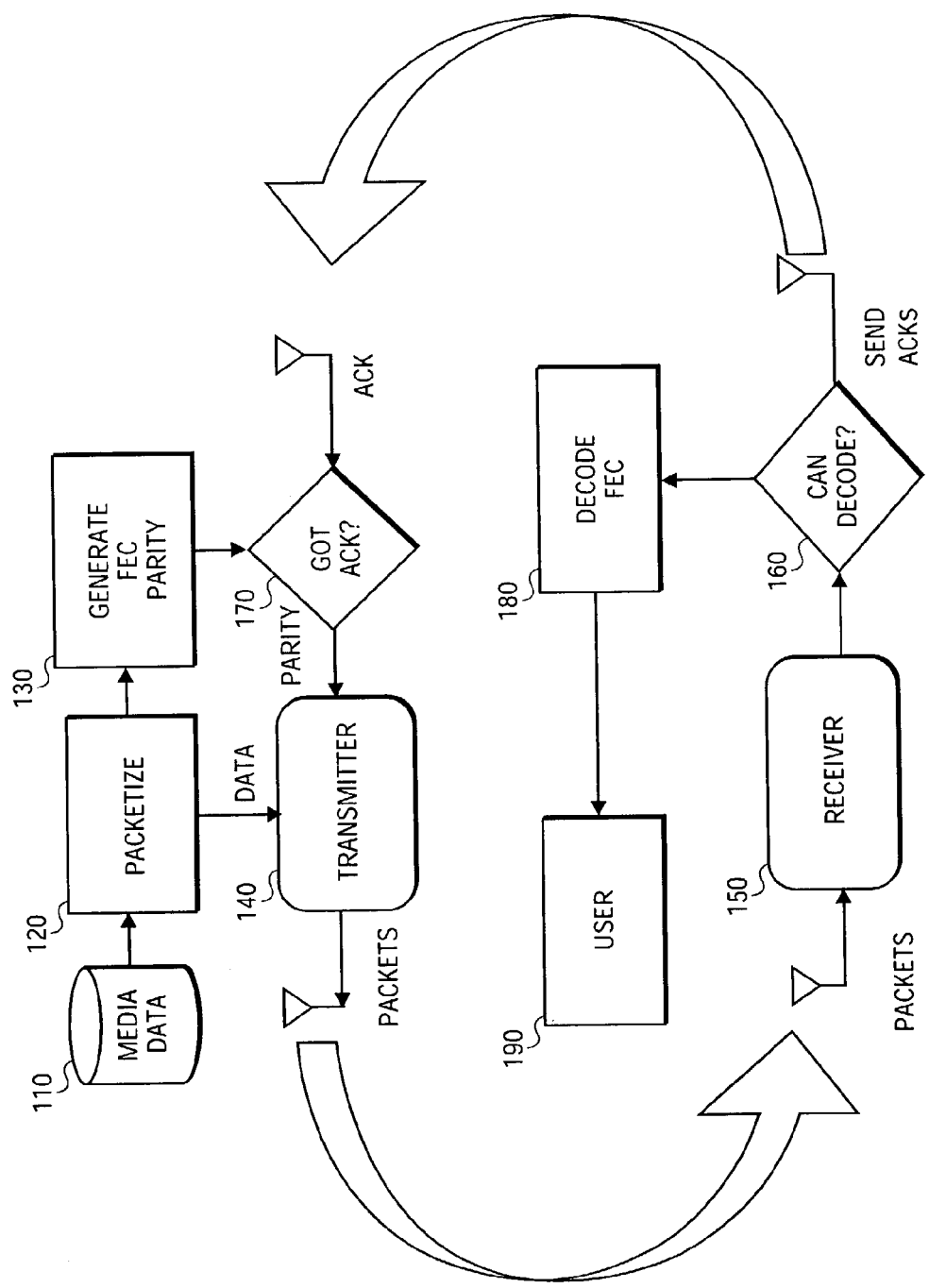
FIG. 1 is a block diagram illustrating the transmission of data packets according to one embodiment.

An exemplary diagram of transmitting packets, according to one embodiment, is presented in FIG. 1. The data 110 is packetized into a Group of Packets (GOP) 120. In one embodiment, the size of the GOP 120 and the packet size are determined by the communication network being used and by the requirements of the application for which the data is being used. For instance, a larger packet size may reduce the overhead due to headers of the transport protocols. On the other hand, the larger packet size may also lead to increased delays and inefficiency in high error-rate environments. The appropriate FEC code is applied to the GOP to generate the desired number of parity packets per GOP 130. The GOP packets together with the parity packets constitute coded GOP (CGOP). In one embodiment, the number of parity packets is chosen depending on the tolerable delay, available bandwidth, and/or channel statistics. Additional considerations may also be considered. The parity packets (also referred to herein as redundancy packets) are generated so that they can replace the lost data packets with reduce overhead. In one embodiment, the parity packets may include the original data. The data and parity packets may contain additional information, possibly in the form of headers, for the overall system control and operation. In one embodiment, a GOP number, a packet number, FEC parameters and/or the packet sizes may be included in the packet.

In one embodiment, the parity packets are generated using the systematic Reed-Solomon (RS) codes, wherein the number of parity packets replaces the same number of data packets so that the data can be decoded intact. Other suitable FEC channel code may be used to generate the parity packets, such as Tornado codes.

After the data is packetized and FEC encoded, the data is sent from the transmitter 140 to the receiver 150. The receiver determines if the transmitting data can be decoded 160. If the data can be decoded 160, an acknowledgement is sent to the transmitter, which in response terminates the transmission of any further parity for the current CGOP 170. The transmission is then decoded 180 and sent to the user 190.

The techniques described herein may be used for robust multimedia communications over networks including wired (IP) networks, cellular packet data networks, wireless LAN's, power and telephone line networks, as well as many proprietary nonstandard packet-based networks.

Figure 2:
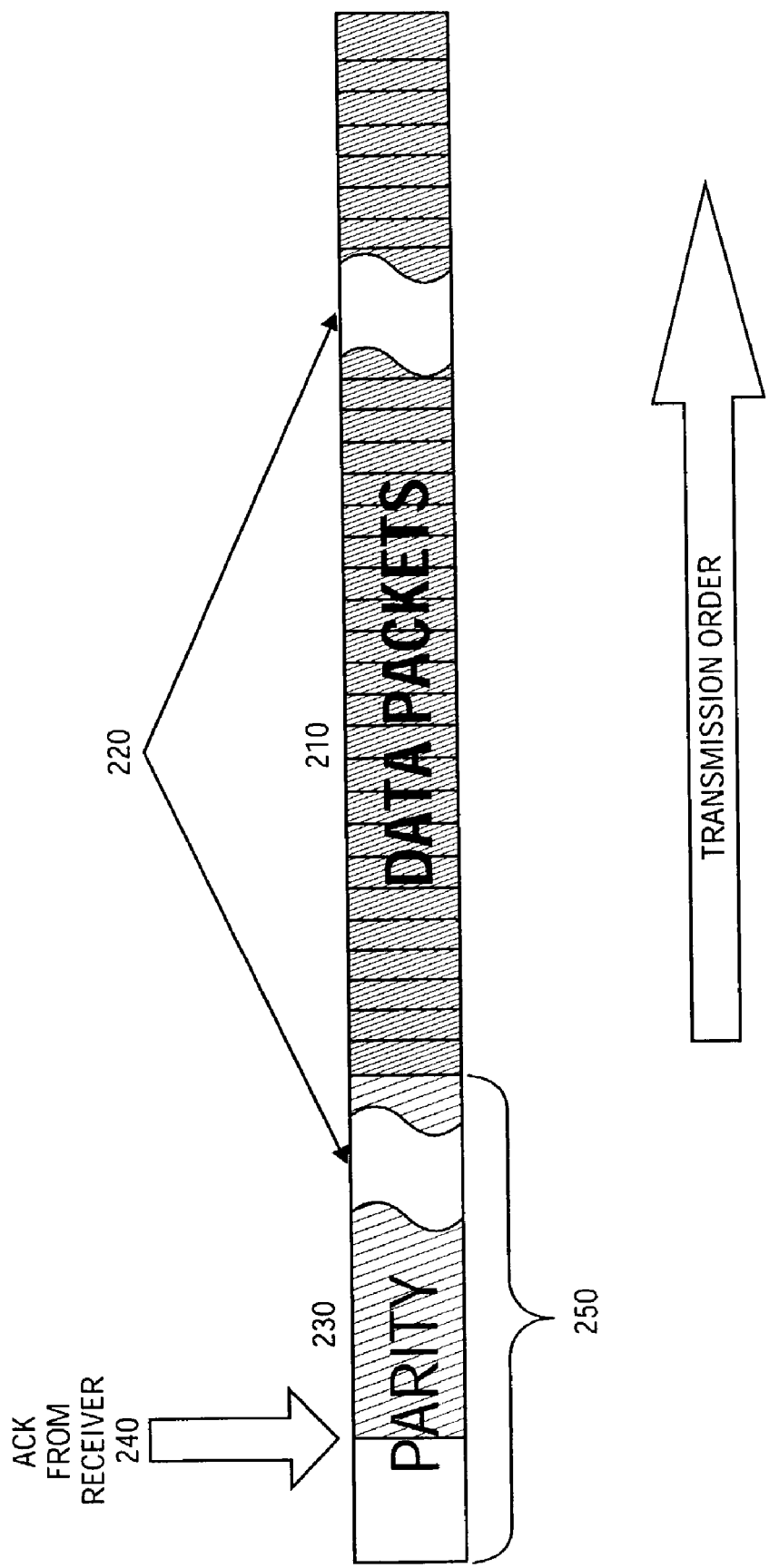
FIG. 2 is a block diagram of one embodiment of a group of packets.

The data and parity packets transmission order according to one embodiment is illustrated in FIG. 2. First the data packets 210 of the current CGOP are sent to the receiver. The data packets may be interleaved with the data, parity packets, or both from other CGOP's 220. The parity packets 230 corresponding to the current CGOP are then sent until the acknowledgement from receiver arrives 240 or until the maximum predetermined amount of parity packets is reached or exceeded 250. In one embodiment, the data packets of the current CGOP are sent before the parity packets of the same CGOP. As a result, the data transmission and processing overhead may be reduced when no packets from the current CGOP have been lost. In one embodiment, packets from different CGOP's can be interleaved to give the receiver enough time to process and send the acknowledgement to the transmitter.

In one embodiment, the receiver implements the GOP acknowledgement protocol, which sends an acknowledgement to the transmitter when the receiver can decode the GOP data. The receiver implicitly asks for more parity by not sending an acknowledgement to the receiver. The receiver may send multiple acknowledgements for the same GOP. Multiple acknowledgments can be used when the receiver suspects that the first acknowledgement was (or can be) lost on the return channel.

In an embodiment using RS coding, the acknowledgement can be sent when the number of correctly received packets equals the number of original data packets. In one embodiment, the acknowledgement can be sent before the actual decoding takes place to reduce the overall latency. If all the data packets arrive without errors no decoding is needed and the data can be passed directly to the user application.

In an embodiment using Tornado coding, the acknowledgement can be sent when the number of correctly received packets equals the number of original data packets times some predetermined constant greater than unity. The latter constant is determined to provide some desired probability of correct decoding and is determined for each Tornado code by a computer simulation. If all the data packets arrive without errors no decoding is needed and the data can be passed directly to the user application.

Several other acknowledgement mechanisms are compatible with this system. In one embodiment, acknowledgment packets include the CGOP number but may also contain additional information. The additional information may be in the form of control messages to the server, channel statistics and/or other information. In the case of errors on the return channel, such as packet erasures, the transmitter simply sends the maximum number of packets allowed by the algorithm and continues to the next GOP. In one embodiment, if after all the parity is sent the data is still not decodable, the transmitter continues to the next GOP. In an embodiment using delay-sensitive multimedia information, the delivery time is upper-bounded so that the proposed solution can be used as is without adding an additional error resolution mechanism.

In one embodiment, the scheduling of the data packets and parity packets is utilized to account for dependencies between the separate GOPs. For example, consider the case where the multimedia unit of a GOP "B" is dependent on a GOP "A". Successful decoding of GOP "A" is needed to decode and present the GOP "B". Such as, in MPEG (Moving Pictures Experts Group) 1/2/4-coded video P (predicted) frames are decoded using the corresponding I (intraframe) frame for prediction. If the I frame data is lost there is very little value in decoding the bitstream corresponding to the dependent P frame.

Figure 3:
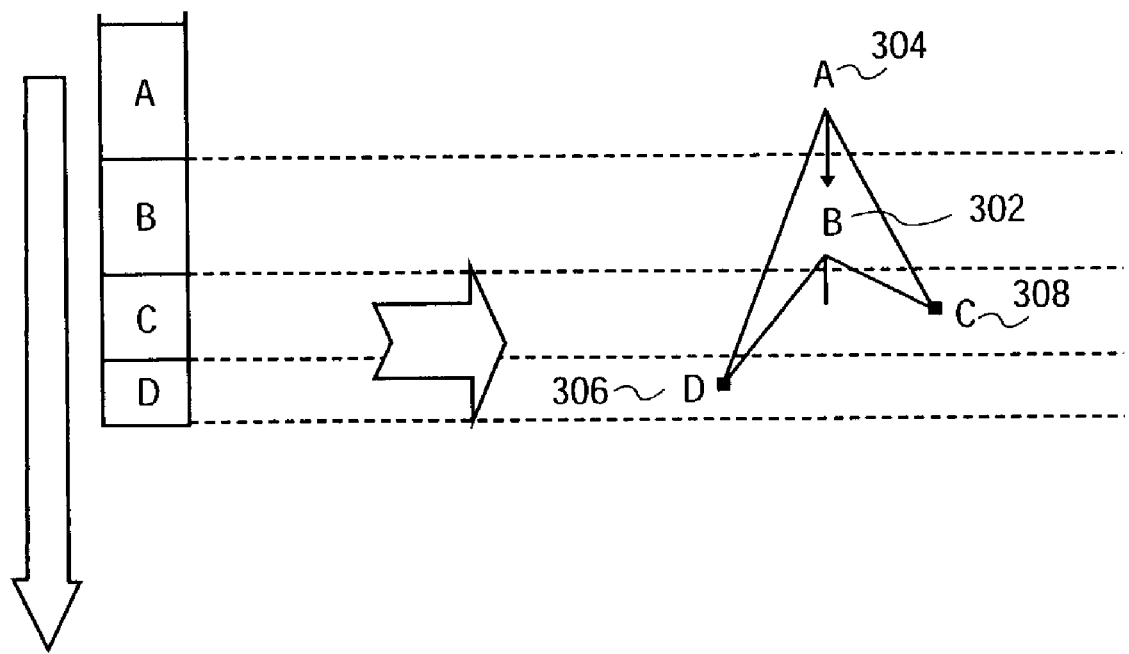
FIG. 3 is a graph illustrating interdependency of separate groups of packets.

FIG. 3 illustrates an exemplary model of data as a collection of dependent data units. As illustrated in the dependency graph of FIG. 3, the GOP "B" 302 is dependent on GOP "A" 304, as well as GOP "D" 306 and GOP "C" 308 are dependent on both GOP "A" and GOP "B".

To account for interdependency between separate GOPs, in one embodiment, the data packets of a GOP that are dependent on a previously sent GOP, are not transmitted until an acknowledgement has been received indicating the previously sent GOP has been successfully received and decoded (or alternatively as determined by the receiving algorithm).

In one embodiment, until an acknowledgement has been received indicating the previously sent GOP has been successfully received and decoded, parity packets for the previously sent GOP continue to be transmitted until all the parity packets (or alternatively a predetermined maximum number of parity packets) have been transmitted or the acknowledgement has been received. In one embodiment, if all of the parity packets for the previously transmitted GOP have been sent and the acknowledgment has not been received, the GOPs that are dependent on the previously transmitted GOP are dropped and not transmitted.

Further, to efficiently utilize the bandwidth of the channel, in one embodiment, data and/or parity packets from one or more separate GOPs that are independent of a previously sent GOP, can be transmitted prior to transmitting data packets for dependent GOPs. Alternatively, the data and/or parity packets from separate GOPs can be interleaved when transmitting a GOP.

In addition, in one embodiment, the data and/or parity packets for the independent GOPs are scheduled to allow enough time to elapse for a receiver to receive, process (e.g., attempt to decode), and send an acknowledgment to the transmitter (otherwise referred to as the acknowledgement propagation time). For example, when scheduling a first GOP, before transmitting any data packets that are dependent on the first GOP, the scheduler would schedule/transmit enough data/parity packets of GOPs independent of the first GOP, to allow for the receiver of the first GOP to receive, process, and send an acknowledgement to the transmitter.

Figure 4:
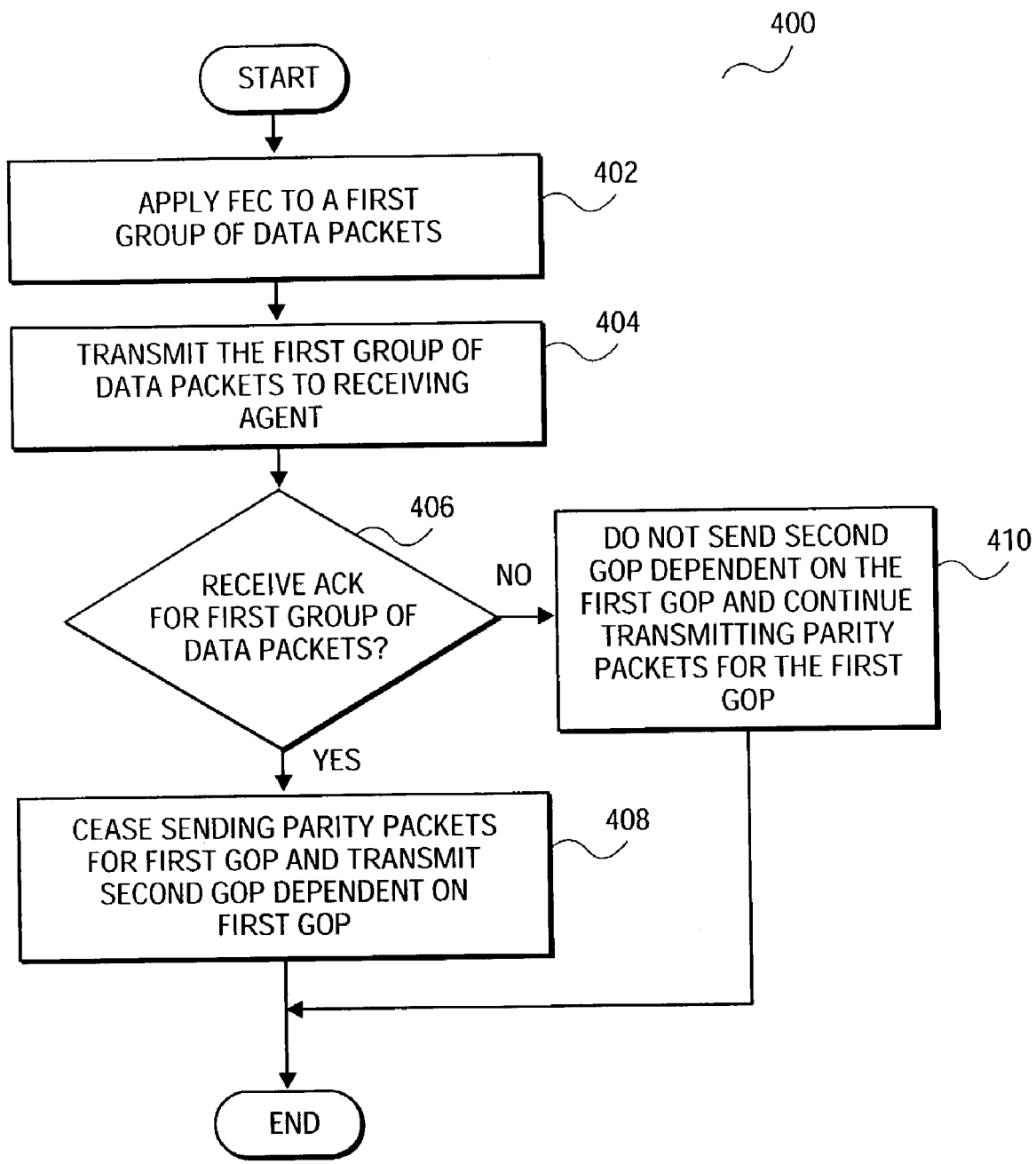
FIG. 4 is a flow chart describing a method of communications over packet channels, according to one embodiment.

FIG. 4 illustrates a flow diagram 400, that describes a method of communication over packet channels in accordance with one embodiment. In process block 402, a sending agent applies a forward error correction code to a first group of data packets to create a coded group of packets by creating a set of parity packets corresponding to the first group of packets.

In process block 404, the sending agent transmits the first group of data packets, and begins transmitting a set of corresponding parity packets after the data packets have been transmitted. In block 406, the sending agent determines if a positive acknowledgment (ack), corresponding to the first group of packets, has been received. If the positive ack has been received, in process block 408, the sending agent ceases to send parity packets corresponding to the first group of packets, and sends a second group of data packets, dependent on the first group of data packets. If the positive ack has not been received, in process block 410, the sending agent does not send the second group of data packets dependent on the first group of data packets, and continues to transmit parity packets corresponding to the first group of data packets.

Figure 5:
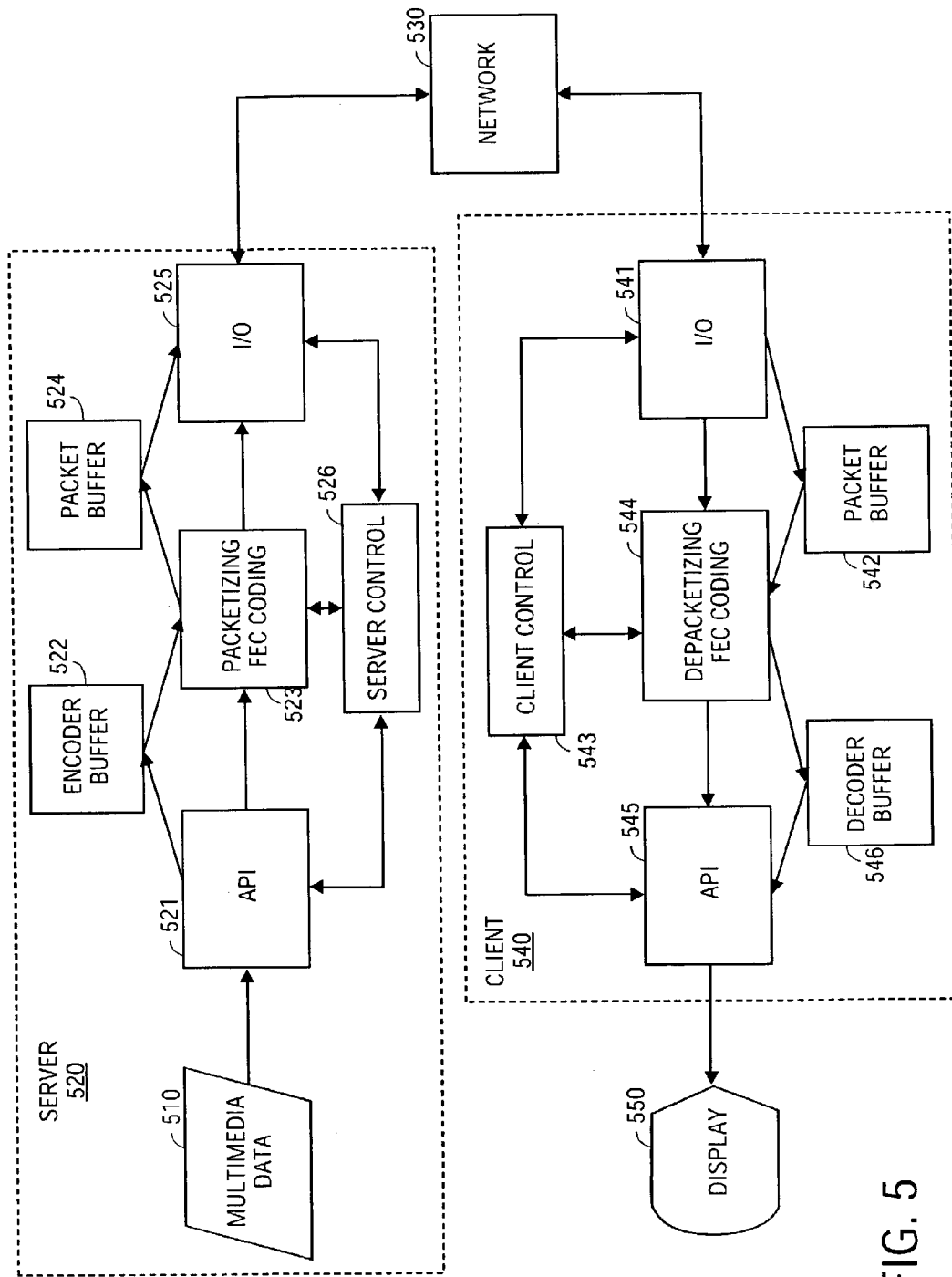
FIG. 5 is a block diagram of a system to transmit data packets according to one embodiment.

FIG. 5 illustrates a block diagram for streaming multimedia data over an IP network, in accordance with one embodiment. The multimedia data 510 consists of audio and/or video data, and is stored within a server 520 in the compressed or uncompressed form. The Application Program Interface (API) 521 is used to encode or transcode the media data and store it in the internal encoder buffer 522. In one embodiment, the encoder may be compliant with a Moving Picture Experts Group (MPEG) or other video and audio coding standards. In one embodiment, the packetizing and FEC coding block 523 create the data and parity packets. The packetized data and parity are stored in the internal packet buffer 524. The API may also provide management functionality similar to the encoder buffer 522. Specifically, the input/output (I/O) block 525 is able to randomly access the data in the packet buffer on a packet basis. The API may provide other additional information about the content of the packets that is needed by the I/O. The I/O block 525 is to perform the packet delivery over the network and to provide the control link between the server and the client for the ACK transmission. In one embodiment, the server is controlled by the server control 526.

At the client side 540, the data from the network 530 is received by the I/O block 541 and is placed into the packet buffer 542. The I/O block is also responsible for sending the ACK's back to the server side at the direction of the client control 543. The depacketizing and FEC decoding block 544 processes the data from the packet buffer 542. The depacketizing and FEC decoding block 544 is responsible for correcting data packet erasures and presenting the multimedia encoded data in a form that can be processed. The compressed multimedia data is passed to the API 545 for the decoding process through the decoding buffer 546. The API 545 decompresses the multimedia data, which may be output to the display 550. The client control 543 manages the data flow between the I/O 541, the depacketizer and FEC 544, and the API 545, and, controls ACK's and other communication to the receiver.

The techniques described above can be stored in the memory of a computer system (e.g., set top box, video recorders, etc.) as a set of instructions to be executed. In addition, the instructions to perform the method described above could alternatively be stored on other forms of machine accessible media, including magnetic and optical disks. For example, the method of the techniques described could be stored on machine accessible media, such as magnetic disks or optical disks, which are accessible via a disk drive (or computer-readable medium drive). Further, the instructions can be downloaded into a computing device over a data network in one of a form of compiled and linked version.

Alternatively, the logic to perform the techniques as discussed above, could be implemented in additional computer and/or machine accessible media, such as discrete hardware components as large-scale integrated circuits (LSI's), application-specific integrated circuits (ASIC's), firmware such as electrically erasable programmable read-only memory (EE-PROM's); and electrical, optical, acoustical and other forms of propagated signals (e.g., carrier waves, infrared signals, digital signals, etc.); etc.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A method comprising:
applying a forward error correction (FEC) code to a first group of data packets to create a set of parity packets corresponding to the first group of data packets;
transmitting the first group of data packets, and transmitting the set of corresponding parity packets after the first group of data packets have been transmitted;
determining whether a second group of data packets is dependent upon the first group of data packets;
in response to receiving a positive acknowledgement corresponding to the first group of packets, ceasing to send parity packets corresponding to the first group of packets and sending the second group of data packets; and
in response to having transmitted all parity packets corresponding to the first group of data packets and having not received the acknowledgement, dropping and not transmitting the second group of data packets when the second group of data packets is dependent upon first group of data packets.

2. A method comprising:
applying a forward error correction (FEC) code to a first group of data packets to create a set of parity packets corresponding to the first group of data packets;
transmitting the first group of data packets and transmitting the set of corresponding parity packets after the first group of data packets have been transmitted;
determining a second group of data packets is dependent upon the first group of data packets;
in response to receiving a positive acknowledgement corresponding to the first group of packets, ceasing to send parity packets corresponding to the first group of packets and sending the second group of data packets;
in response to not receiving the acknowledgement, not sending the second group of data packets when the second group of data packets is dependent upon the first group of data packets and continuing to transmit the parity packets corresponding to the first group of data packets; and
transmitting the set of parity packets corresponding to the first group of data packets after a separate set of data packets have been transmitted, wherein a period of time to transmit the separate set of data packets is equal to or greater than a predetermined period of time.

3. The method of claim 2, wherein the predetermined period of time is equal to or greater than a predicted propagation time to receive the positive acknowledgement corresponding to the first group of data packets.

4. A method comprising:
applying a forward error correction code to a first and second group of data packets to create a set of parity packets corresponding to the first and second group of data packets, the second group of data packets independent of the first group of data packets;
transmitting the first and second group of data packets, and transmitting the set of corresponding parity packets after the data packets have been transmitted;
determining a third group of data packets is dependent upon the first group of data packets;
in response to receiving a positive acknowledgement corresponding to the first group of packets, ceasing to send parity packets corresponding to the first group of packets and sending the third group of data packets; and
in response to not receiving the acknowledgment, not sending the third group of data packets, when the third group of data packets is dependent upon the first group of data packets, and continuing to transmit the parity packets.

5. The method of claim 4, wherein in response to not receiving the acknowledgment, continuing to transmit the parity packets corresponding to the first group of data packets includes until all parity packets corresponding to the first group of data packets have been transmitted.

6. The method of claim 5, wherein in response to having transmitted all parity packets corresponding to the first group of data packets and having not received the acknowledgment, dropping and not transmitting the third group of data packets.

7. The method of claim 4, wherein the transmitting of the first group of data packets includes interleaving the first group of data packets with the second group of data packets.

8. The method of claim 4, wherein the transmitting of the first group of data packets includes interleaving the first group of data packets with parity packets corresponding to separate group of data packets.

9. The method of claim 4, further including transmitting the set of parity packets corresponding to the first group of data packets after the second set of packets have been transmitted, wherein a period of time to transmit the second set of packets is equal to or greater than a predetermined period of time.

10. The method of claim 9, wherein the predetermined period of time is equal to or greater than a predicted propagation time to receive the positive acknowledgement corresponding to the first group of data packets.

11. A system comprising:
an encoder to apply a forward error correction code to a first group of data packets create a set of parity packets corresponding to the first group of data packets;
a transmitter to transmit the first group of data packets and begin to transmit the set of parity packets after sending the first group of data packets;
the transmitter to determine a second group of data packets is dependent upon the first group of data packets;
the transmitter to cease sending the parity packets corresponding to the first group of packets and begin sending the second group of data packets, in response to receiving a positive acknowledgement corresponding to the first group of packets;
the transmitter to continue sending the parity packets corresponding to the first group of packets, in response to not receiving the acknowledgment for the first group of data packets;
the transmitter, in response to not receiving the acknowledgment, to continue to transmit the parity packets corresponding to the first group of data packets until all parity packets corresponding to the first group of data packets have been transmitted; and
the transmitter, in response to having transmitted all parity packets corresponding to the first group of data packets and having not received the acknowledgement, is to drop and not transmit the second group of data packets when the second group of data packets is dependent upon the first group of data packets.

12. A machine-accessible medium that provides instructions that, if executed by a machine, will cause the machine to perform operations comprising:
applying a forward error correction (FEC) code to a first group of data packets to create a set of parity packets corresponding to the first group of data packets;
transmitting the first group of data packets, and transmitting the set of corresponding parity packets after the first group of data packets have been transmitted;
determining a second group of data packets is dependent upon the first group of data packets;
in response to receiving a positive acknowledgement corresponding to the first group of packets, ceasing to send parity packets and sending the second group of data packets;
in response to not receiving the acknowledgment, not sending the second group of data packets and continuing to transmit the parity packets corresponding to the first group of data packets;
in response to not receiving the acknowledgement, continuing to transmit the parity packets corresponding to the first group of data packets until all parity packets corresponding to the first group of data packets have been transmitted; and
in response to having transmitted all parity packets corresponding to the first group of data packets and having not received the acknowledgement, dropping and not transmitting the second group of data packets when the second group of data packets is dependent upon the first group of data packets.

13. A machine-accessible medium that provides instructions that, if executed by a machine, will cause the machine to perform operations comprising:
applying a forward error correction (FEC) code to a first group of data packets to create a set of parity packets corresponding to the first group of data packets;
transmitting the first group of data packets, and transmitting the set of corresponding parity packets after the first group of data packets have been transmitted;
determining a second group of data packets is dependent upon the first group of data packets;
in response to receiving a positive acknowledgement corresponding to the first group of packets, ceasing to send parity packets and sending the second group of data packets;
in response to not receiving the acknowledgment, not sending the second group of data packets, when the second group of data packets is dependent upon the first group of data packets, and continuing to transmit the parity packets corresponding to the first group of data packets; and
transmitting a set of parity packets corresponding to the first group of data packets after a separate set of data packets have been transmitted, wherein a period of time to transmit the separate set of data packets is equal to or greater than a predetermined period of time.

14. The machine-accessible medium of claim 13, wherein the predetermined period of time is equal to or greater than a predicted propagation time to receive the positive acknowledgement corresponding to the first group of data packets.

* * * * *

UNITED STATES PATENT AND TRADEMARK OFFICE
CERTIFICATE OF CORRECTION

PATENT NO. : 7,584,404 B2
APPLICATION NO. : 10/325416
DATED : September 1, 2009
INVENTOR(S) : Kozintsev et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1567 days.

Signed and Sealed this

Fourteenth Day of September, 2010

David J. Kappos
*Director of the United States Patent and Trademark Office*